United States Patent
Lencioni et al.

(10) Patent No.: US 8,456,194 B2
(45) Date of Patent: Jun. 4, 2013

(54) LEVEL SHIFTER WITH PRIMARY AND SECONDARY PULL-UP CIRCUITS

(75) Inventors: Michael J. Lencioni, Austin, TX (US); Sundararajan Rangarajan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 288 days.

(21) Appl. No.: 12/948,689

(22) Filed: Nov. 17, 2010

(65) Prior Publication Data

US 2012/0119812 A1 May 17, 2012

(51) Int. Cl.
*H03K 19/0175* (2006.01)

(52) U.S. Cl.
USPC ............... 326/81; 326/87; 327/112; 327/333

(58) Field of Classification Search
USPC ................... 326/63, 68, 80–81, 87; 327/112, 327/270, 333
See application file for complete search history.

(56) References Cited

U.S. PATENT DOCUMENTS

| | | | | |
|---|---|---|---|---|
| 5,698,993 | A * | 12/1997 | Chow | 326/81 |
| 6,002,290 | A * | 12/1999 | Avery et al. | 327/333 |
| 6,046,621 | A * | 4/2000 | Crowley | 327/333 |
| 6,130,556 | A * | 10/2000 | Schmitt et al. | 326/81 |
| 6,518,790 | B2 * | 2/2003 | Wada et al. | 326/81 |
| 7,425,860 | B2 * | 9/2008 | Nomura | 327/333 |
| 7,808,294 | B1 * | 10/2010 | Kottapalli | 327/333 |
| 7,847,612 | B2 * | 12/2010 | Ku | 327/333 |
| 7,956,642 | B2 * | 6/2011 | Lee | 326/68 |
| 7,994,821 | B1 * | 8/2011 | Wang et al. | 326/81 |
| 2003/0058023 | A1* | 3/2003 | Aoki | 327/333 |
| 2006/0164147 | A1* | 7/2006 | Nomura | 327/333 |

* cited by examiner

*Primary Examiner* — Jason M Crawford
(74) *Attorney, Agent, or Firm* — Williams, Morgan & Amerson, P.C.

(57) ABSTRACT

A level shifter includes first and second input terminals, first and second output terminals, first pull-down circuitry operable to pull down one of the first and second output terminals responsive to signals present on the first and second input terminals, first pull-up circuitry operable to pull up the first output terminal responsive to a signal present on the second output terminal or pull up the second output terminal responsive to a signal present on the first output terminal, and second pull-up circuitry operable to pull up one of the first and second output terminals responsive to the signals present on the first and second input terminals.

18 Claims, 2 Drawing Sheets

LEVEL SHIFTER WITH PRIMARY AND SECONDARY PULL-UP CIRCUITS

CROSS-REFERENCE TO RELATED APPLICATIONS

Not applicable.

BACKGROUND

The disclosed subject matter relates generally to integrated circuit devices and, more particularly, to a level shifter with primary and secondary pull-up circuits.

Modern integrated circuit (IC) devices often have to interface with IC devices from previous technology generations. However, the complementary metal-oxide semiconductor (CMOS) voltage levels on IC devices from previous technology generations are usually different from those on IC devices from the current technology generation. Also, modern CMOS "System on a Chip" (SOC) devices employ several different voltages on the same IC device. Thus, to provide proper interfacing between different CMOS voltage levels, modern IC devices typically include input/output (I/O) buffers that are capable of driving voltages greater or less than the source voltage. Also, in modern IC devices, clock-generation circuitry (e.g., phase locked loops) and the primary logic are in different voltage domains. Thus, the primary logic clocks have to be level-shifted between different voltage domains. To address these I/O buffer or voltage domain issues, a level shifter may be employed to allow the changing of the signal voltage. For a level-shifter used to level-shift clock signals, not only do the voltage-shifting characteristics need to be robust, but also the duty cycle and the delay need to be addressed.

In general, a level shifter is coupled to a power supply having a voltage different from the source voltage. In response to the values of the input signals, the level shifter circuit uses a set of output drivers to provide output voltages corresponding to the power supply voltage. For example, a level shifter may receive input signals ranging from 0 V to 0.7 V and provide output signals ranging from 0 V to 3.3 V, accordingly.

Typically, a level shifter includes a first output stage (OUT) for providing a logic output having the same logic state as the differential input signal and a complimentary output stage (OUTX) having a complimentary logic state compared to the differential input signal. A level shifter typically uses differently sized pull-up and pull-down transistors to improve writeability. For example, the N-type pull-down transistor that receives the input signal is typically larger than the P-type pull-up transistor used at the output. As a result, the rise time for the level shifter is typically faster than the fall time, introducing a skew between the OUT and OUTX outputs of the level shifter.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a level shifter including first and second input terminals, first and second output terminals, first pull-down circuitry operable to pull down one of the first and second output terminals responsive to signals present on the first and second input terminals, first pull-up circuitry operable to pull up the first output terminal responsive to a signal present on the second output terminal or pull up the second output terminal responsive to a signal present on the first output terminal, and second pull-up circuitry operable to pull up one of the first and second output terminals responsive to the signals present on the first and second input terminals.

Another aspect of the disclosed subject matter is seen in a level shifter including first and second input terminals, first and second output terminals, a first pull-down transistor coupled to the first output terminal and having a gate coupled to one of the first and second input terminals, a second pull-down transistor coupled to the second output terminal and having a gate coupled to the one of the first and second input terminals not coupled to the gate of the first pull-down transistor, a first pull-up transistor coupled to the first output terminal and having a gate coupled to the second output terminal, a second pull-up transistor coupled to the second output terminal and having a gate coupled to the first output terminal, a third pull-up transistor coupled to the first output terminal and having a gate coupled one of the first and second input terminals, a fourth pull-up transistor coupled to the second output terminal and having a gate coupled to the other of the first and second input terminals not coupled to the gate of the third pull-up transistor.

Yet another aspect of the disclosed subject matter is seen in a circuit including first and second terminals, a first circuit for generating first signals on first and second terminals, wherein the first signals generated by the first circuit exhibit a falling edge rate that is faster than a rising edge rate, third and fourth terminals, and inverting compensation circuitry coupled between the first and second terminals operable to generate second signals on the third and fourth terminals corresponding to the first signals, wherein the second signals generated by the inverting compensation circuit exhibit a rising edge rate that is slower than a falling edge rate.

Still another aspect of the disclosed subject matter is seen in a device including first circuitry operating at a first voltage, second circuitry operating at a second voltage, and a level shifter coupled between the first and second circuitry. The level shifter includes first and second input terminals, first and second output terminals, first pull-down circuitry operable to pull down one of the first and second output terminals responsive to signals present on the first and second input terminals, first pull-up circuitry operable to pull up the first output terminal responsive to a signal present on the second output terminal or pull up the second output terminal responsive to a signal present on the first output terminal, and second pull-up circuitry operable to pull up one of the first and second output terminals responsive to the signals present on the first and second input terminals.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
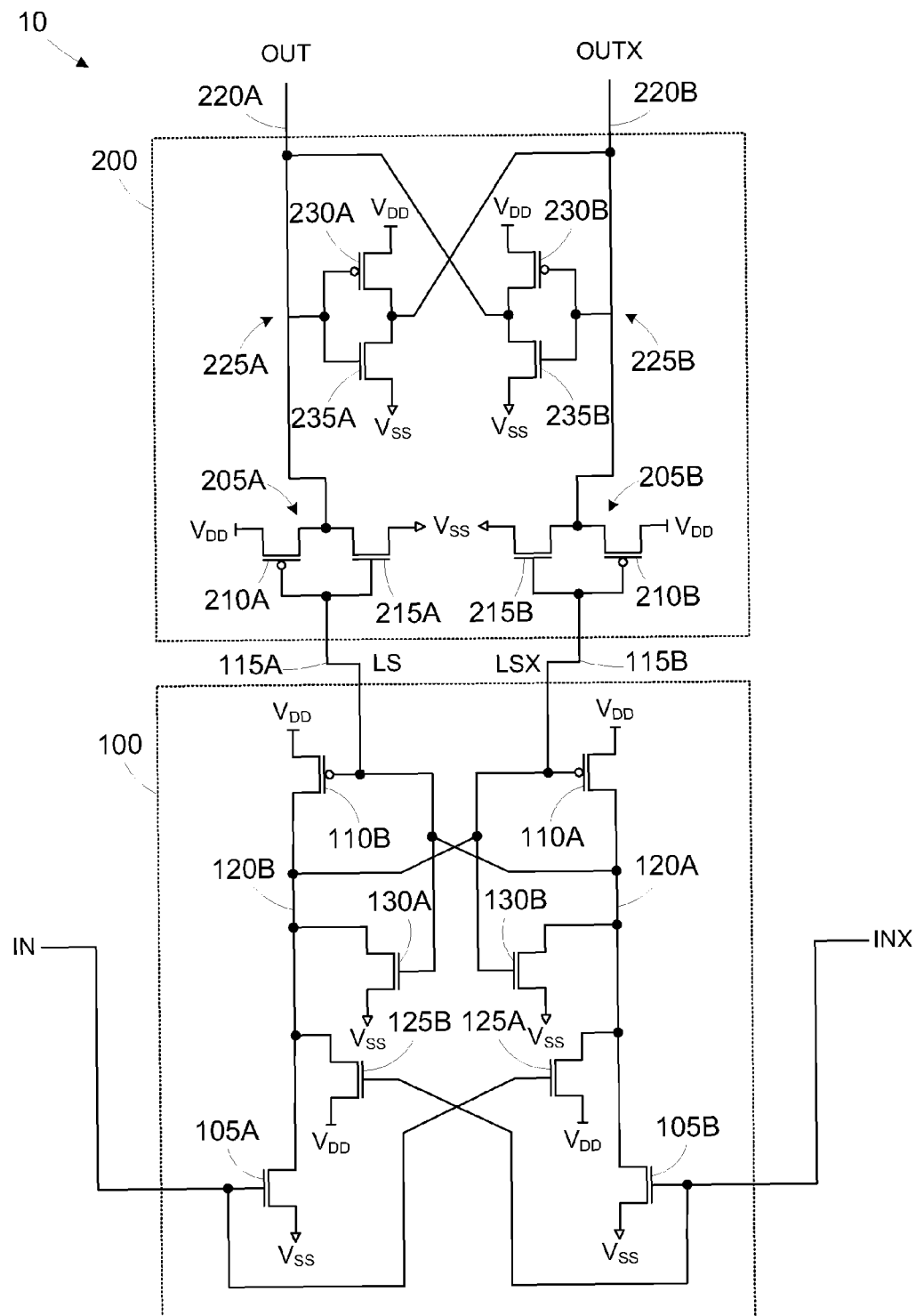
FIG. 1 is a circuit diagram of a level shifter in accordance with one illustrative embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In one embodiment, the present subject matter is directed to a level shifter with additional pull up circuitry for increasing the rise time of the circuit. In addition to pull-down circuitry triggered by signals on the input terminals and pull-up circuitry triggered by the output terminal of the corresponding node, pull-up circuitry triggered by the signals on the input terminals is also provided.

Referring now to the drawings wherein like reference numbers correspond to similar components throughout the several views and, specifically, referring to FIG. 1, the disclosed subject matter shall be described in the context of a level shifter 10 including a level shifting stage 100 and an edge rate compensation stage 200. The level shifting stage 100 and the edge rate compensation stage 200 are symmetrical in construction and operation, so only one side of the circuits is described in detail herein. In general, one set of elements responds to a logic "1" on the input, and the other set of elements responds in the same manner to a logic "0". In general, the set of elements responding to a logic "1" is denoted by "A" after the reference numeral, while the set of elements responding to a logic "0" is denoted by "B". The circuits described herein respond to differential inputs, so the terms logic "1" and logic "0" are relative. A logic "1" may represent that the voltage on one differential input is higher than the other input, rather than implying that one input is at a high voltage and the other is at ground.

The level shifting stage 100 includes pull-down N-type transistors 105A, 105B having gates coupled to the input terminals of the level shifter 10, IN and INX, respectively. The gates of pull-up P-type transistors 110A, 110B are coupled to output nodes 115A, 115B (i.e., or terminals), LS, LSX of the level shifting stage 100, respectively. Intermediate nodes 120A, 120B are defined between the transistors 105B, 105A and the transistors 110B, 110A, respectively. The pull-down transistors 105A, 105B and the pull-up transistors 110A, 110B pull up or pull down the voltage on the associated intermediate nodes responsive to the signal values on the inputs, IN, INX. Additional pull-up N-type transistors 125A, 125B are coupled to the intermediate nodes 120A, 120B, respectively, and additional pull-down N-type transistors 130A, 130B are also coupled to the intermediate nodes 120B, 120A, respectively.

For purposes of the following illustration, it is assumed that a high voltage or logic "1" is received at the inputs of the level shifter 10. The logic "1" enables the pull-down transistor 105A, coupling the intermediate node 120B to the negative supply voltage, $V_{SS}$ (e.g., ground). The logic "1" also enables the secondary pull-up transistor 125A, which couples the intermediate node 120B to the high voltage supply, $V_{DD}$.

The intermediate node 120A is coupled to the output node 115B. Thus, as the voltage on the intermediate node 120A goes low, the output node 115B is also driven low (i.e., to a logic "0" state). The low voltage at the output node 115B enables the primary pull-up transistor 110A, thereby coupling the intermediate node 120A to $V_{DD}$ through the pull-up transistor 110A. Because the intermediate node 120B is coupled to the output node 115A, as the voltage on the intermediate node 120B goes high, the output node 115A is driven to a logic "1" state. Since the intermediate node 120A is coupled to $V_{DD}$ through both the primary and secondary pull-down transistors 110A, 125A, the rise time is decreased, thereby increasing the response speed of the level shifting stage 100 as well as the overall response speed of the level shifter 10.

As the output node 115A goes high, the secondary pull-down transistor 130A is enabled, thereby coupling the intermediate node 120B to $V_{SS}$ through a second path and decreasing the fall time for the output node 115B. The secondary pull-down transistors 130A, 130B are provided for start-up conditioning to reduce the fall time of the level shifting stage 100.

Because the size of the pull-down transistor 105A is larger than that of the pull-up transistor 110A in the illustrated embodiment to provide enhanced writability, the fall time is smaller than the rise time. This difference in transition times introduces skew between the outputs, LS, LSX, of the level shifting stage 100. This skew results in duty cycle distortion in a clock signal.

The edge rate compensation stage 200 is coupled to the level shifting stage 100 to reduce the edge rate difference between rising and falling edges, thereby improving the duty cycle. The edge rate compensation stage 200 includes first inverters 205A, 205B coupled to the output nodes 115A, 115B of the level shifting stage 100, respectively. Each inverter 205A, 205B includes a pull-up P-type transistor 210A, 210B coupled to $V_{DD}$ and a pull-down N-type transistor 215A, 215B coupled to $V_{SS}$. Output nodes 220A, 220B (OUTX, OUT) of the edge rate compensation stage 200 are coupled to the first inverters 205A, 205B. The edge rate compensation stage 200 also includes second inverters 225A, 225B that cross-couple the output nodes 220A, 220B. Each inverter 225A, 225B includes a pull-up P-type transistor 230A, 230B coupled to $V_{DD}$ and a pull-down N-type transistor 235A, 235B coupled to $V_{SS}$. The first and second inverters 205A, 205B, 225A, 225B define a cross coupled differential driver.

In the illustrated embodiment, the pull-up transistors 210A, 210B and the pull-down transistors 215A, 215B in the first inverters 205A, 205B have a beta ratio of approximately 1, meaning that they are substantially the same size. The pull-up transistors 230A, 230B and the pull-down transistors 235A, 235B in the second inverters 225A, 225B also have a beta ratio of approximately 1. The beta ratio of 1 provides that the pull-down transistors 210A, 210B, 230A, 230B have about the same width as the corresponding pull-up transistors 215A, 215B, 235A, 235B. As a result, the edge rate compensation stage 200 will compensate for the edge rate distortions arising from the level shifting stage 100 because it is an inverting stage and has a falling edge rate faster than a rising edge rate. Although the beta ratio is 1 in the illustrated embodiment, it is contemplated that other ratios may be used as long as the fall/time rise time characteristics are maintained. This effect may be accomplished as long as the beta ratio is less than the optimal beta ratio for the CMOS technology used (i.e., the pull-down transistors are sized to conduct around the same or less than current conducted by the pull-up transistors, while accommodating noise issues for a given technology).

Due to the inverting nature of the edge rate compensation stage 200, the output, LSX, of the level shifting stage 100 having the faster fall time corresponds to the output, OUT, of the edge rate compensation stage 200 having the slower rise time, and the output, LS, of the level shifting stage 100 having the slower rise time corresponds to the output, OUTX, of the edge rate compensation stage 200 having the faster fall time. Thus, the fall/rise time characteristics of edge rate compensation stage 200 are reversed with respect to those of the level shifting stage 100 to mitigate the apparent skew. In designing the level shifter 10, the fanouts on the outputs LS, LSX of the level shifting stage 100 are kept low to reduce the absolute difference between the rise and fall times. This low fanout approach minimizes the insertion delay and reduces the jitter induced on the clock. The differential nature of the edge rate compensation stage 200 reduces duty cycle distortion and rise/fall time variation. However, it is contemplated that a non-differential edge rate compensation stage 200 may also be used.

The level shifting stage 100 may also be employed in an application where differential outputs are not required. In such an application, the devices 230A, 230B, 235A, 235B, may be omitted and the output may be connected to either of the output nodes 220A or 220B, with the non-used output node being omitted as well.

Figure 2:
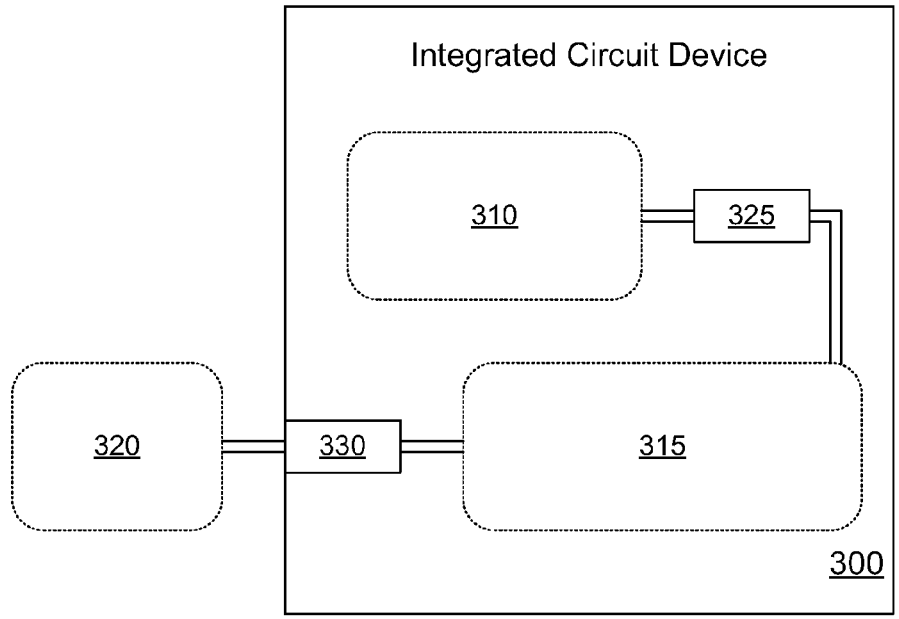
FIG. 2 is a simplified diagram of a device having different voltage domains and incorporating the level shifter of FIG. 1.

Turning now to FIG. 2, a simplified block diagram of an integrated circuit device 300, such as a central processing unit, graphics processing unit, application specific integrated circuit, memory device, etc., is shown. The device 300 includes a plurality of voltage domains, including a first voltage domain 310 and a second voltage domain 315 internal to the device 300 and a third voltage domain 320 external to the device. In general, the domains 310, 315, 320 each represent circuitry operating at a particular voltage.

A first level shifter 325, such as the level shifter 10 of FIG. 1 (e.g., with or without the edge rate compensation stage 200), may be provided between the first and second voltage domains 310, 315. For example, the first voltage domain 310 may represent a clock signal generation circuit (e.g., PLL), and the second voltage domain 315 may represent a CPU.

A second level shifter 330, again such as the level shifter 10 of FIG. 1 (e.g., with our without the edge rate compensation stage 200), may also be provided between the external voltage domain 320 and the second voltage domain 315. For example, the external voltage domain 320 may represent the voltage at which I/O signals are communicated external to the device 300, and the second voltage domain 315 may represent the voltage employed by the CPU.

Figure 3:
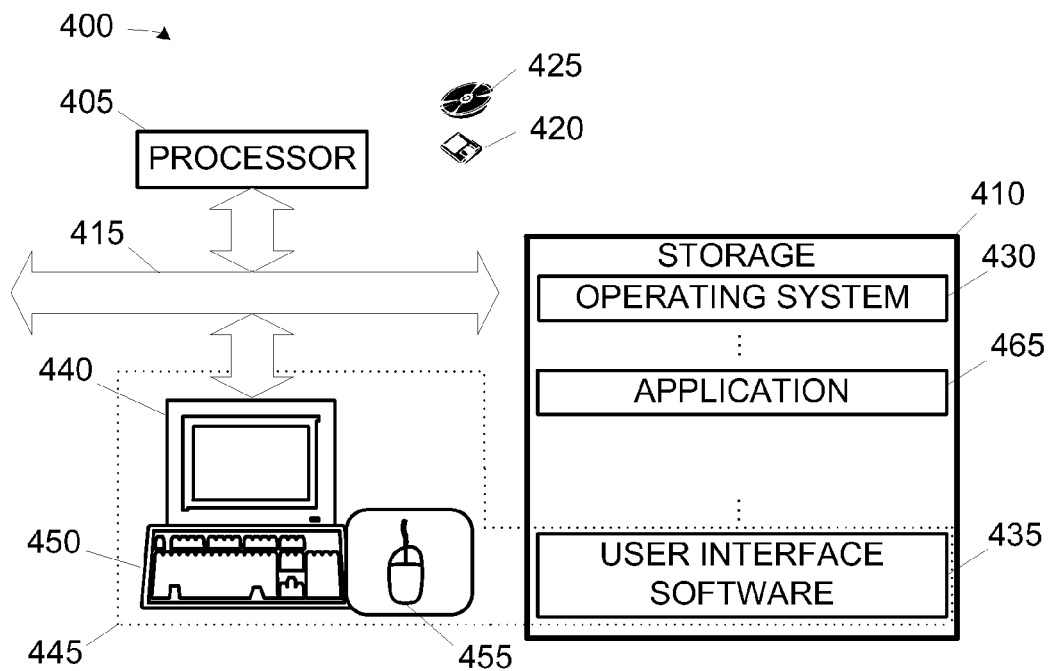
FIG. 3 is a simplified diagram of a computer apparatus that may be programmed to direct the fabrication of the level shifter of FIG. 1.

FIG. 3 illustrates a simplified diagram of selected portions of the hardware and software architecture of a computing apparatus 400 such as may be employed in some aspects of the present subject matter. The computing apparatus 400 includes a processor 405 communicating with storage 410 over a bus system 415. The storage 410 may include a hard disk and/or random access memory ("RAM") and/or removable storage, such as a magnetic disk 420 or an optical disk 425. The storage 410 is also encoded with an operating system 430, user interface software 435, and an application 465. The user interface software 435, in conjunction with a display 440, implements a user interface 445. The user interface 445 may include peripheral I/O devices such as a keypad or keyboard 450, mouse 455, etc. The processor 405 runs under the control of the operating system 430, which may be practically any operating system known in the art. The application 465 is invoked by the operating system 430 upon power up, reset, user interaction, etc., depending on the implementation of the operating system 430. The application 465, when invoked, performs a method of the present subject matter. The user may invoke the application 465 in conventional fashion through the user interface 445. Note that although a stand-alone system is illustrated, there is no need for the data to reside on the same computing apparatus 400 as the application 465 by which it is processed. Some embodiments of the present subject matter may therefore be implemented on a distributed computing system with distributed storage and/or processing capabilities.

It is contemplated that, in some embodiments, different kinds of hardware descriptive languages (HDL) may be used in the process of designing and manufacturing very large scale integration circuits (VLSI circuits), such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., storage 410, disks 420, 425, solid state storage, and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into the computing apparatus 400, and executed by the processor 405 using the application 465, which may then control, in whole or part, the operation of a semiconductor manufacturing facility (or fab) to create semiconductor products and devices. For example, in one embodiment, silicon wafers containing the level shifter 10 may be created using the GDSII data (or other similar data).

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A level shifter, comprising:
   first and second input terminals;
   first and second output terminals;
   first pull-down circuitry operable to pull down one of the first and second output terminals responsive to signals present on the first and second input terminals;
   first pull-up circuitry operable to pull up the first output terminal responsive to a signal present on the second output terminal or pull up the second output terminal responsive to a signal present on the first output terminal;
   second pull-up circuitry operable to pull up one of the first and second output terminals responsive to the signals present on the first and second input terminals; and
   second pull-down circuitry operable to pull down the first output terminal responsive to a signal present on the second output terminal and pull down the second output terminal responsive to a signal present on the first output terminal.

2. The level shifter of claim 1, wherein a falling edge rate associated with the first pull-down circuitry is faster than a rising edge rate associated with the first and second pull-up circuitry, further comprising inverting compensation circuitry coupled to the first and second output terminals and having associated rise and falling edge rates, wherein the rising edge rate of the inverting compensation circuitry is slower than the falling edge rate of the inverting compensation circuitry.

3. The level shifter of claim 1, wherein first signals generated at the first and second output terminals exhibit a falling edge rate that is faster than a rising edge rate, and the level shifter further comprises:
   inverting compensation circuitry coupled between the first and second output terminals and operable to generate second signals on third and fourth output terminals corresponding to the first signals, wherein the second signals generated by the inverting compensation circuit exhibit a rising edge rate that is slower than a falling edge rate.

4. The level shifter of claim 3, wherein the inverting compensation circuitry comprises:
   a first inverter coupled between the first output terminal and the third output terminal;
   a second inverter coupled between the second output terminal and the fourth output terminal;
   a third inverter coupled between the third output terminal and the fourth output terminal; and
   a fourth inverter coupled between the fourth output terminal and third output terminal.

5. The level shifter of claim 4, wherein the first, second, third, and fourth inverters each include a first N-type transistor coupled to a second P-type transistor, and a beta ratio of the first and second transistors is approximately 1.

6. A level shifter, comprising:
   first and second input terminals;
   first and second output terminals;
   a first pull-down transistor coupled to the first output terminal and having a gate coupled to one of the first and second input terminals;
   a second pull-down transistor coupled to the second output terminal and having a gate coupled to the one of the first and second input terminals not coupled to the gate of the first pull-down transistor;
   a first pull-up transistor coupled to the first output terminal and having a gate coupled to the second output terminal;
   a second pull-up transistor coupled to the second output terminal and having a gate coupled to the first output terminal;
   a third pull-up transistor coupled to the first output terminal and having a gate coupled one of the first and second input terminals;
   a fourth pull-up transistor coupled to the second output terminal and having a gate coupled to the other of the first and second input terminals not coupled to the gate of the third pull-up transistor;
   a third pull-down transistor coupled to the first output terminal and having a gate coupled to the second output terminal; and
   a fourth pull-down transistor coupled to the second output terminal and having a gate coupled to the first output terminal.

7. The level shifter of claim 6, further comprising:
   a first inverter coupled to the first output terminal, the output of the first inverter comprising a third output terminal; and
   a second inverter coupled to the second output terminal, the output of the second inverter comprising a fourth output terminal.

8. The level shifter of claim 7, wherein the first and second inverters each include a first N-type transistor coupled to a second P-type transistor, and a beta ratio of the first and second transistors is approximately 1.

9. The level shifter of claim 7, further comprising:
   a third inverter coupled between the third and fourth output terminals; and
   a fourth inverter coupled between the fourth and third output terminals.

10. The level shifter of claim 9, wherein the third and fourth inverters each include a first N-type transistor coupled to a second P-type transistor, and a beta ratio of the first and second transistors is approximately 1.

11. A device, comprising:
   first circuitry operating at a first voltage;
   second circuitry operating at a second voltage; and
   a level shifter coupled between the first and second circuitry, the level shifter comprising:
      first and second input terminals;
      first and second output terminals;
      first pull-down circuitry operable to pull down one of the first and second output terminals responsive to signals present on the first and second input terminals;
      first pull-up circuitry operable to pull up the first output terminal responsive to a signal present on the second output terminal or pull up the second output terminal responsive to a signal present on the first output terminal;
      second pull-up circuitry operable to pull up one of the first and second output terminals responsive to the signals present on the first and second input terminals; and
      second pull-down circuitry operable to pull down the first output terminal responsive to a signal present on the second output terminal and pull down the second output terminal responsive to a signal present on the first output terminal.

12. The device of claim 11, wherein a falling edge rate associated with the first pull-down circuitry is faster than a rising edge rate associated with the first and second pull-up circuitry, further comprising inverting compensation circuitry coupled to the first and second output terminals and having associated rise and falling edge rates, wherein the rising edge rate of the inverting compensation circuitry is slower than the falling edge rate of the compensation circuitry.

13. A non-transitory computer readable storage device encoded with data that, when implemented in a manufacturing facility, adapts the manufacturing facility to create an apparatus, comprising:
   first and second input terminals;
   first and second output terminals;
   first pull-down circuitry operable to pull down one of the first and second output terminals responsive to signals present on the first and second input terminals;
   first pull-up circuitry operable to pull up the first output terminal responsive to a signal present on the second output terminal or pull up the second output terminal responsive to a signal present on the first output terminal;
   second pull-up circuitry operable to pull up one of the first and second output terminals responsive to the signals present on the first and second input terminals; and
   second pull-down circuitry operable to pull down the first output terminal responsive to a signal present on the second output terminal and pull down the second output terminal responsive to a signal present on the first output terminal.

14. The non-transitory computer readable storage device of claim 13, encoded with data that, when implemented in the manufacturing facility, adapts the manufacturing facility to create the apparatus, wherein a falling edge rate associated with the first pull-down circuitry is faster than a rising edge rate associated with the first and second pull-up circuitry, and the apparatus further comprises inverting compensation circuitry coupled to the first and second output terminals and having associated rise and falling edge rates, wherein the rising edge rate of the inverting compensation circuitry is faster than the falling edge rate of the inverting compensation circuitry.

15. The non-transitory computer readable storage device of claim 14, encoded with data that, when implemented in the manufacturing facility, adapts the manufacturing facility to create the apparatus, wherein the inverting compensation circuitry comprises:
   a first inverter coupled to the first output terminal, the output of the first inverter comprising a third output terminal;
   a second inverter coupled to the second output terminal, the output of the second inverter comprising a fourth output terminal;
   a third inverter coupled between the first and second output terminals; and
   a fourth inverter coupled between the second and first output terminals.

16. The non-transitory computer readable storage device of claim 15, encoded with data that, when implemented in the manufacturing facility, adapts the manufacturing facility to create the apparatus, wherein the third and fourth inverters each include a first N-type transistor coupled to a second P-type transistor, and a beta ratio of the first and second transistors is approximately 1.

17. The non-transitory computer readable storage device of claim 13, wherein first signals generated at the first and second output terminals exhibit a falling edge rate that is faster than a rising edge rate, and the computer readable storage device is encoded with data that, when implemented in a manufacturing facility, adapts the manufacturing facility to create the apparatus, further comprising:
   inverting compensation circuitry coupled between the first and second output terminals and operable to generate second signals on third and fourth output terminals corresponding to the first signals, wherein the second signals generated by the inverting compensation circuit exhibit a rising edge rate that is slower than a falling edge rate.

18. The non-transitory computer readable storage device of claim 17, encoded with data that, when implemented in the manufacturing facility, adapts the manufacturing facility to create the apparatus, wherein the inverting compensation circuitry comprises:
   a first inverter coupled between the first terminal and the third terminal;
   a second inverter coupled between the second terminal and the fourth terminal;
   a third inverter coupled between the third and fourth terminals; and
   a fourth inverter coupled between the fourth and third terminals.

* * * * *